(12) United States Patent
Liaw

(10) Patent No.: US 6,597,055 B2
(45) Date of Patent: Jul. 22, 2003

(54) REDUNDANCY STRUCTURE IN SELF-ALIGNED CONTACTS

(75) Inventor: Jhon-Jhy Liaw, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/859,300

(22) Filed: May 18, 2001

(65) Prior Publication Data

US 2001/0021560 A1 Sep. 13, 2001

Related U.S. Application Data

(62) Division of application No. 09/329,783, filed on Jun. 10, 1999, now Pat. No. 6,319,758.

(51) Int. Cl.[7] .............................................. H01L 29/00
(52) U.S. Cl. ...................................... 257/529; 257/665
(58) Field of Search ................................. 257/529, 640, 257/665, 641

(56) References Cited

U.S. PATENT DOCUMENTS

| | | | | |
|---|---|---|---|---|
| 4,651,409 A | | 3/1987 | Ellsworth et al. .......... 29/576 B |
| 5,567,643 A | | 10/1996 | Lee et al. ...................... 437/60 |
| 5,729,041 A | | 3/1998 | Yoo et al. .................... 257/529 |
| 5,754,089 A | | 5/1998 | Chen et al. .................. 337/297 |
| 6,300,252 B1 | * | 10/2001 | Ying et al. .................. 438/723 |
| 6,307,213 B1 | * | 10/2001 | Huang et al. .................. 257/50 |
| 6,307,273 B1 | * | 10/2001 | Chien et al. ................. 257/797 |

* cited by examiner

Primary Examiner—Richard Elms
Assistant Examiner—Brad Smith
(74) Attorney, Agent, or Firm—George O. Sailes; Stephen B. Ackerman; Billy Knowles

(57) ABSTRACT

A fuse link redundancy structure to implement redundant circuits within an integrated circuit has an insulating layer over a conductive layer of the fuse link is sufficiently thin and transparent to allow destruction of the conductive layer by an intense laser light. The redundancy structure has a fusible link formed of a layer of a conductive material deposited upon an insulating layer such as field oxide on the semiconductor substrate and connected between the redundant circuits and other circuits present on the integrated circuit. The layer of conductive material is either formed of a metal such as Aluminum or Tungsten, a heavily doped polycrystalline silicon, or an alloy of a metal such as Tungsten and a heavily doped polycrystalline silicon. A hard mask layer is placed upon the layer of conductive material during transistor processing to protect the layer of conductive material during formation of self-aligned sources and drains of transistors of the integrated circuit. The hard mask layer is removed from the layer of conductive layer for deposition of interlayer dielectric layers on the semiconductor substrate to improve a fuse destruction to implement the redundant circuits. An opening is formed in the interlayer dielectric layers to thin the interlayer dielectric layers to allow exposure of the layer of conductive material to facilitate destruction of the layer of conductive material.

13 Claims, 10 Drawing Sheets

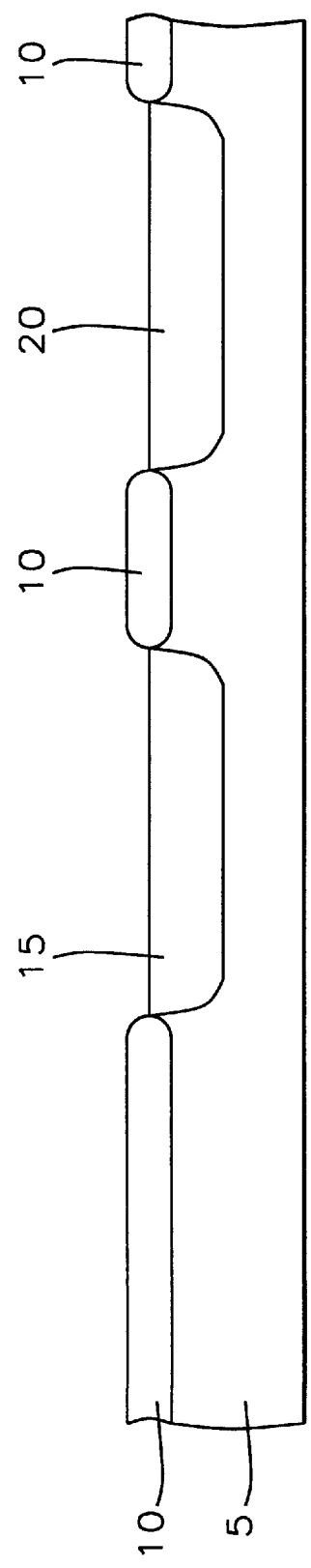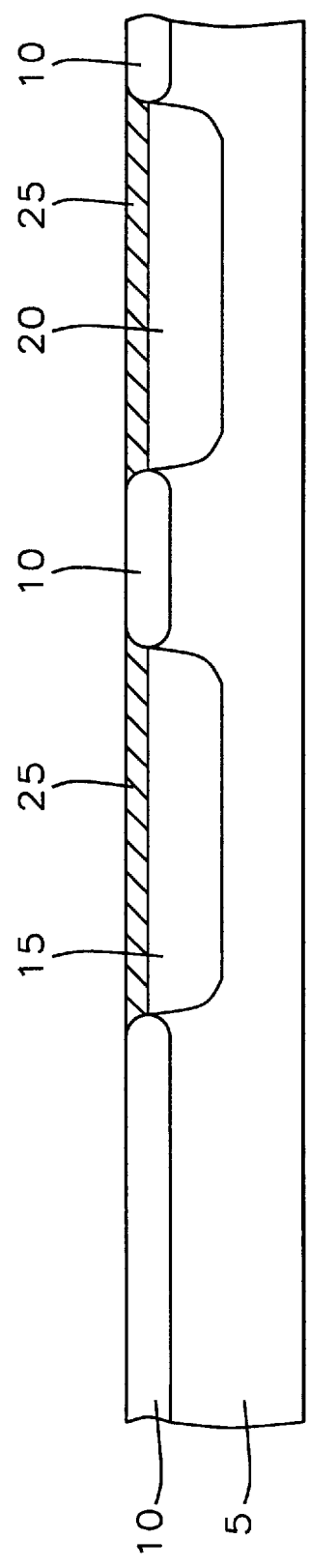
FIG. 1a – Prior Art
FIG. 1b – Prior Art

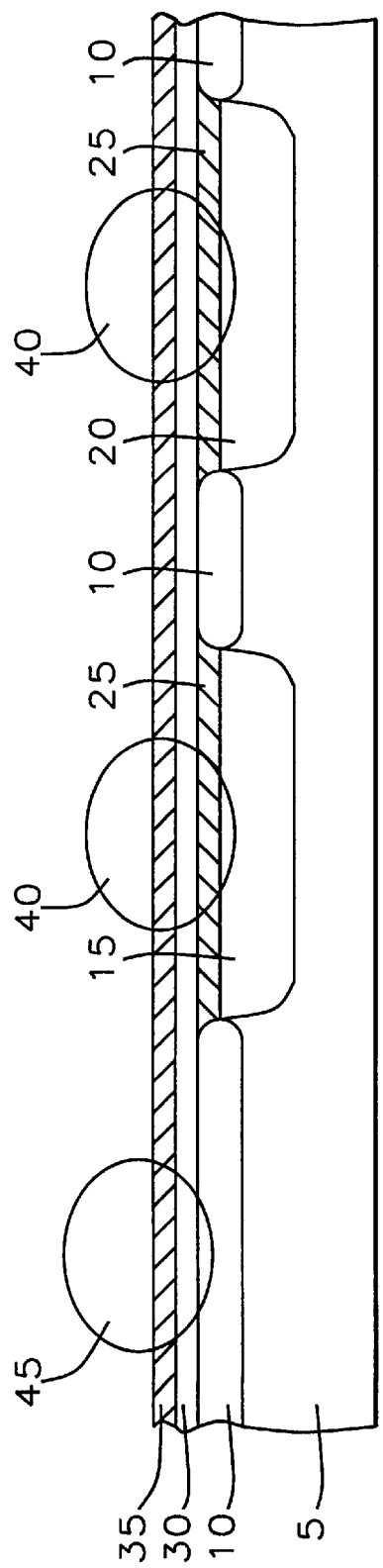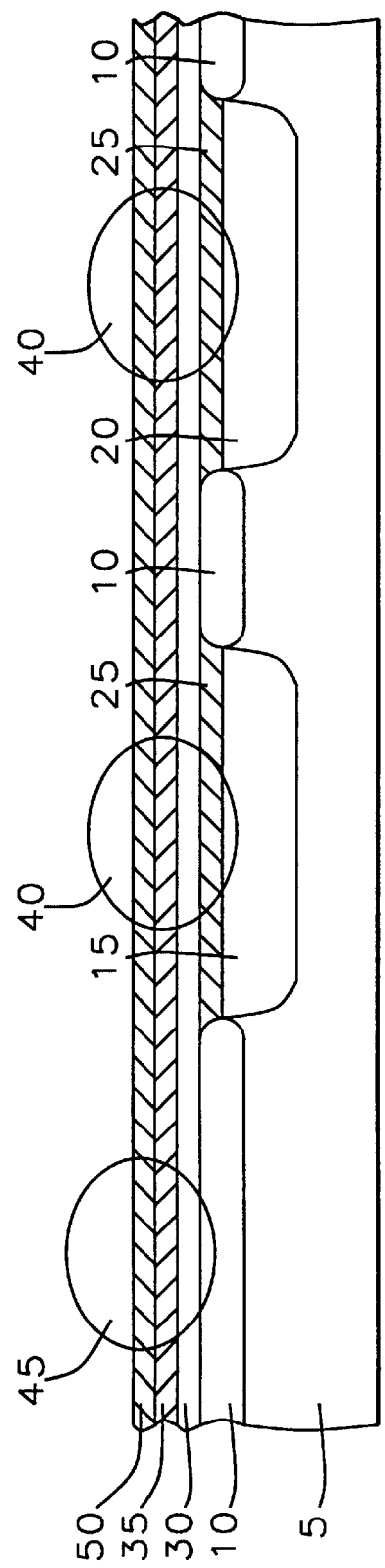
FIG. 1c – Prior Art
FIG. 1d – Prior Art

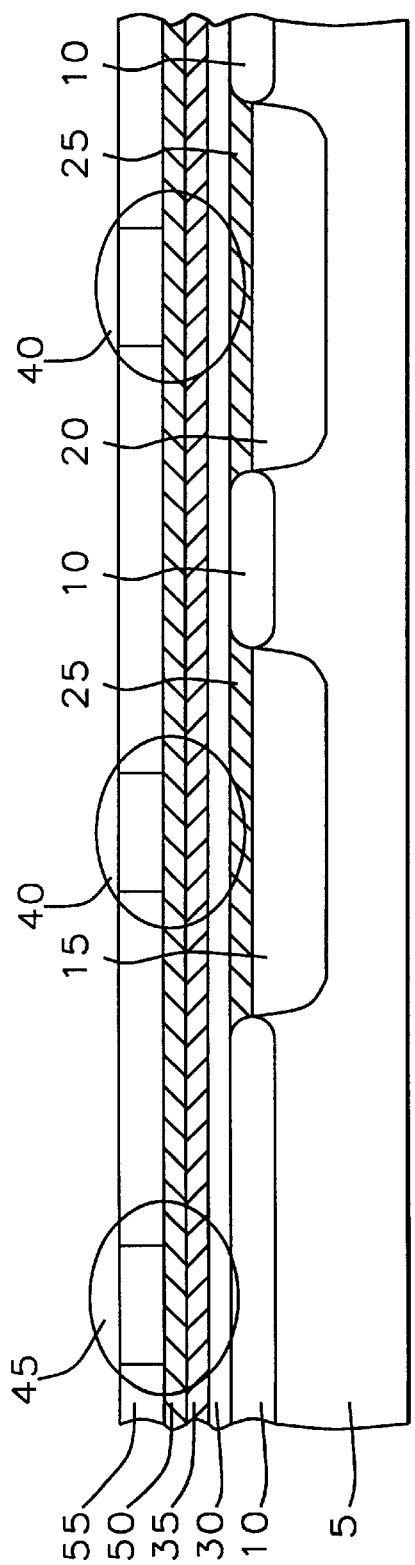
FIG. 1e – Prior Art
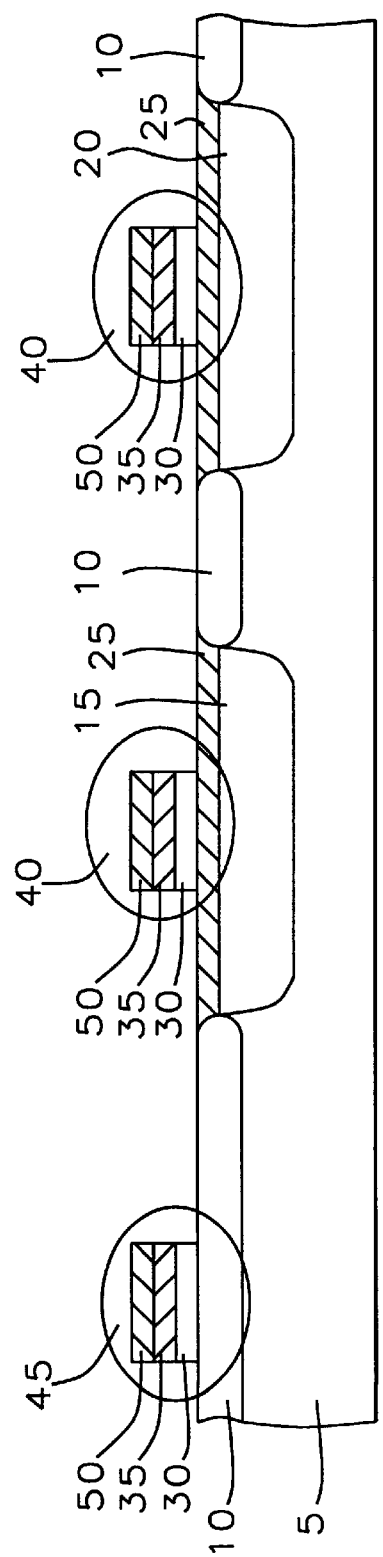
FIG. 1f – Prior Art

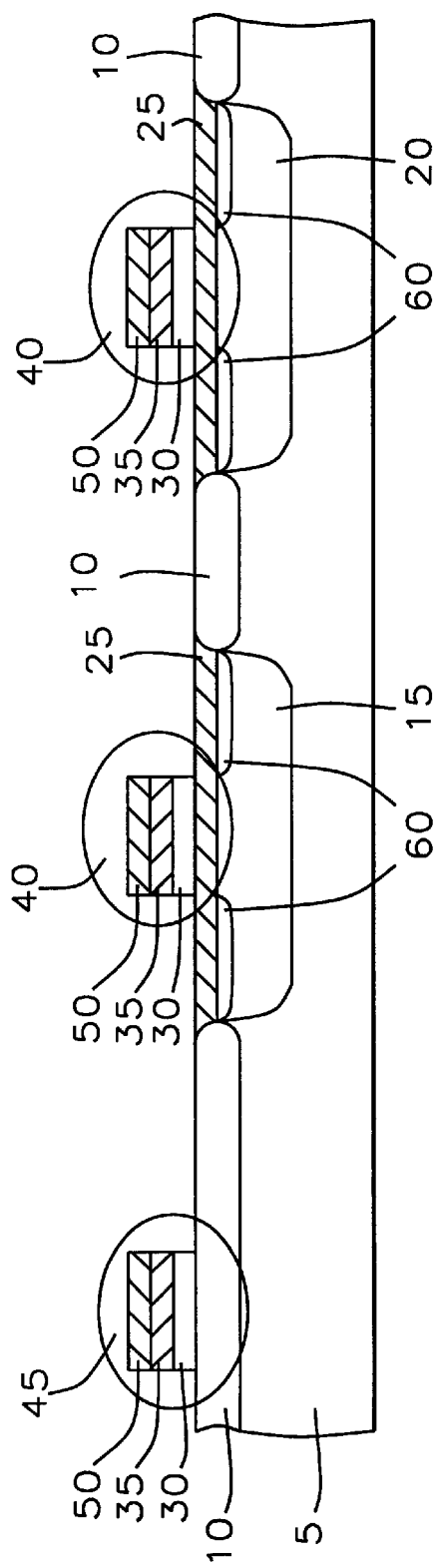
FIG. 1g – Prior Art
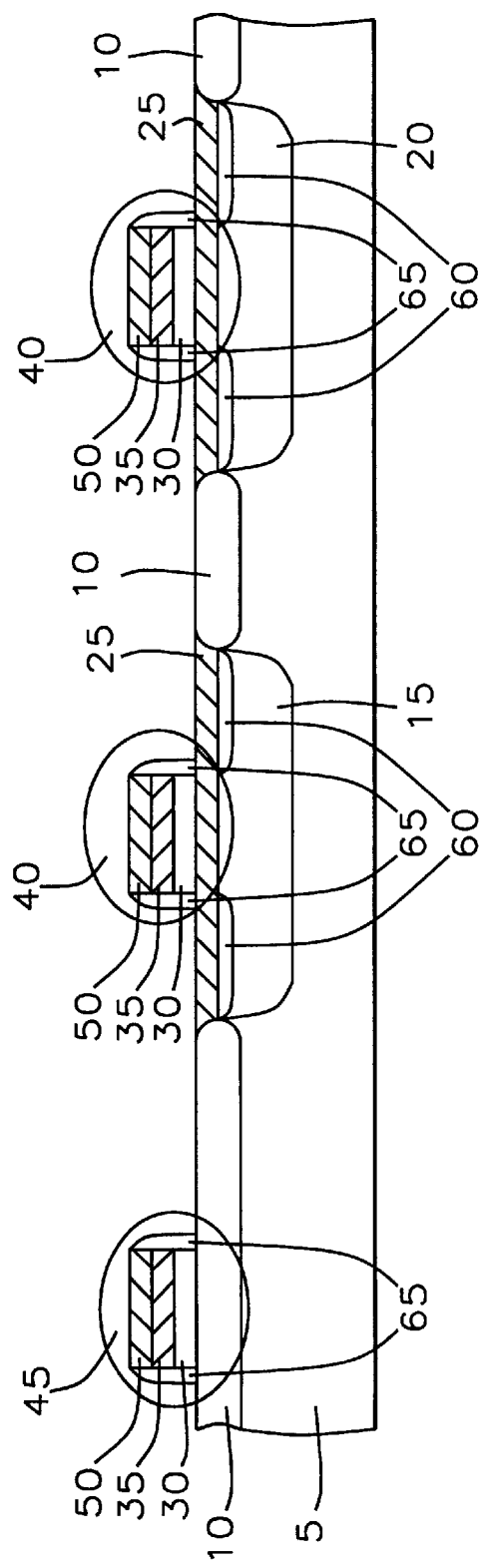
FIG. 1h – Prior Art

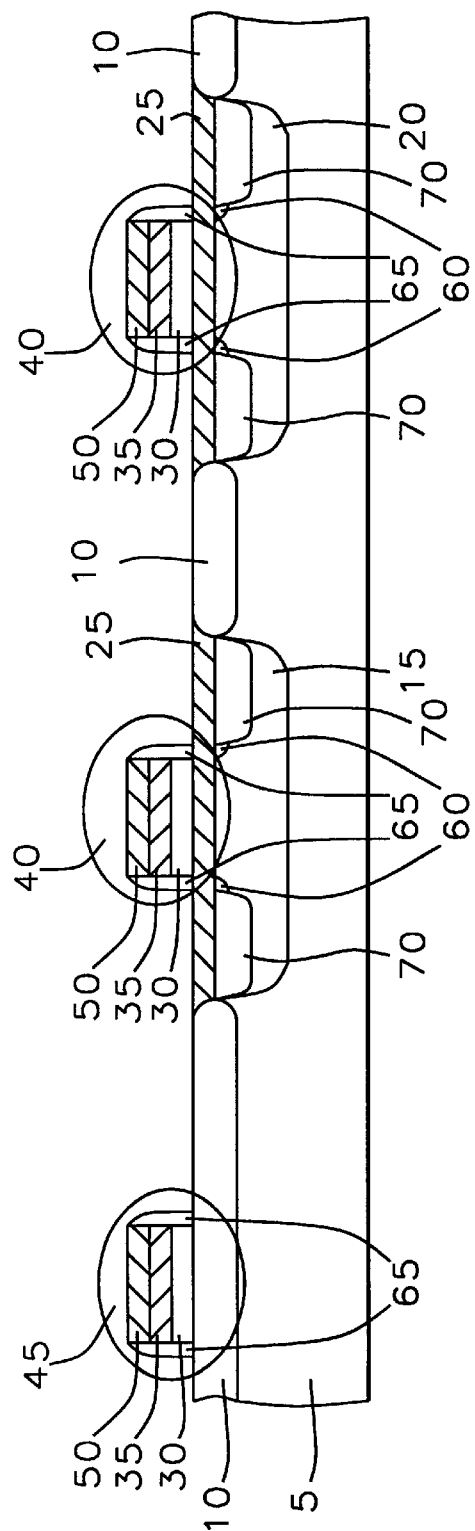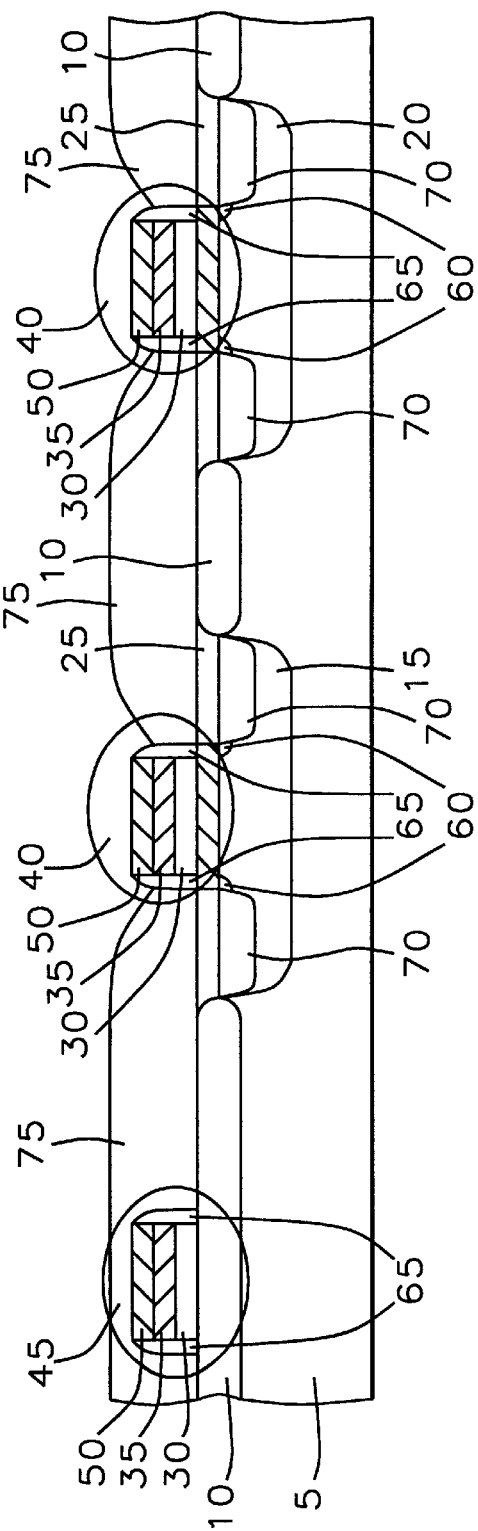

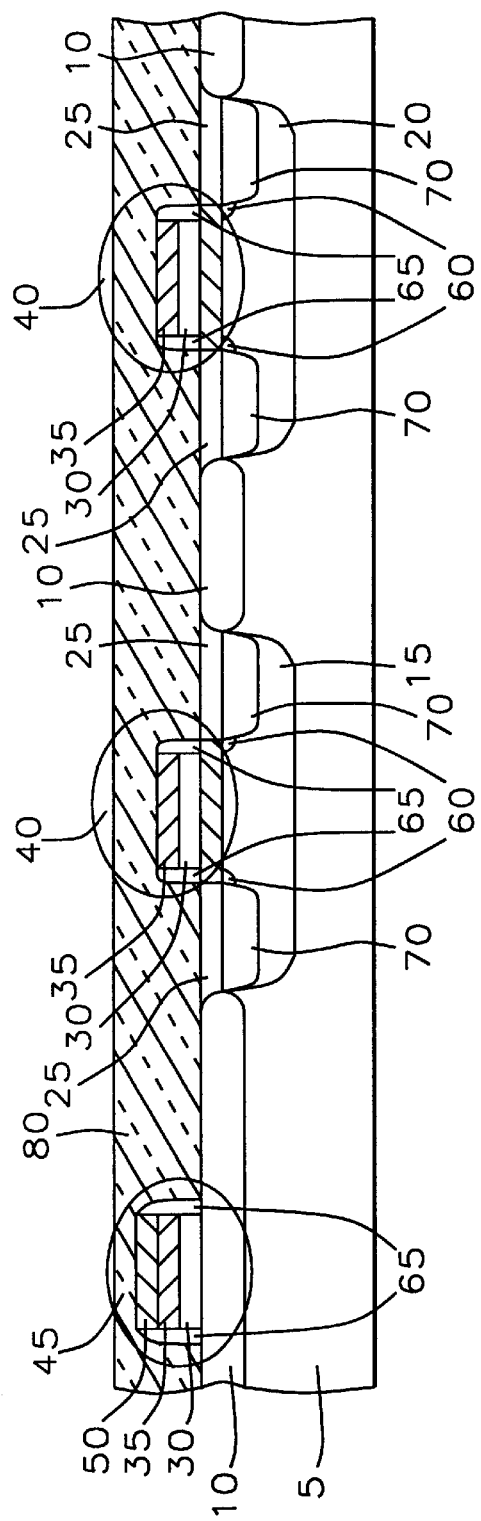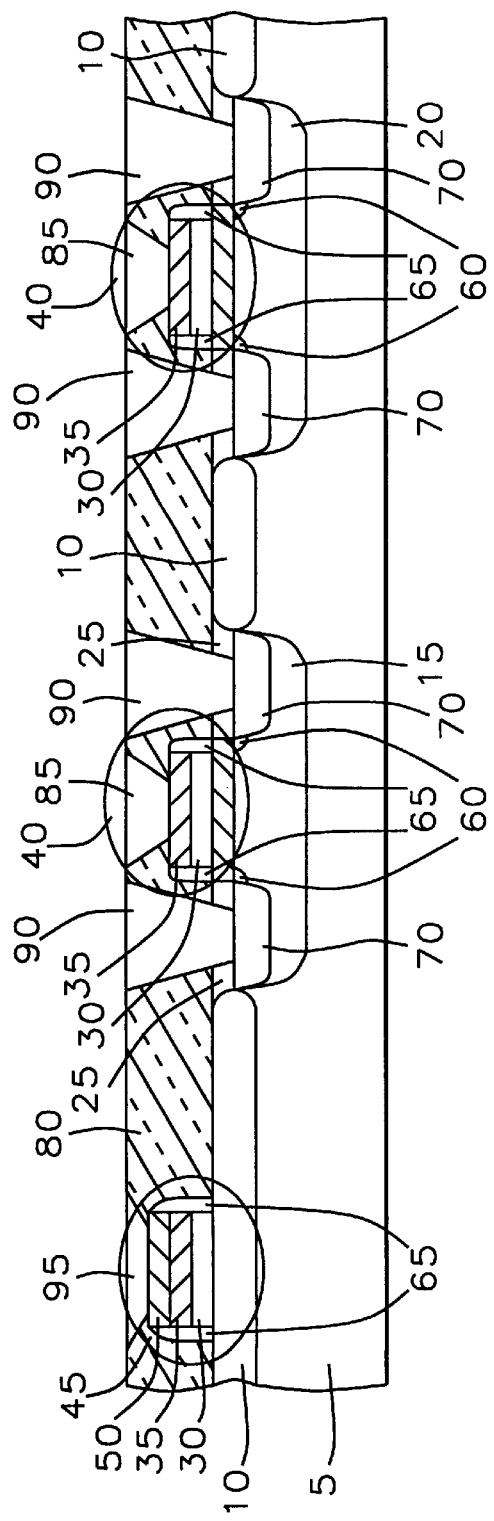
FIG. 1k – Prior Art
FIG. 1l – Prior Art

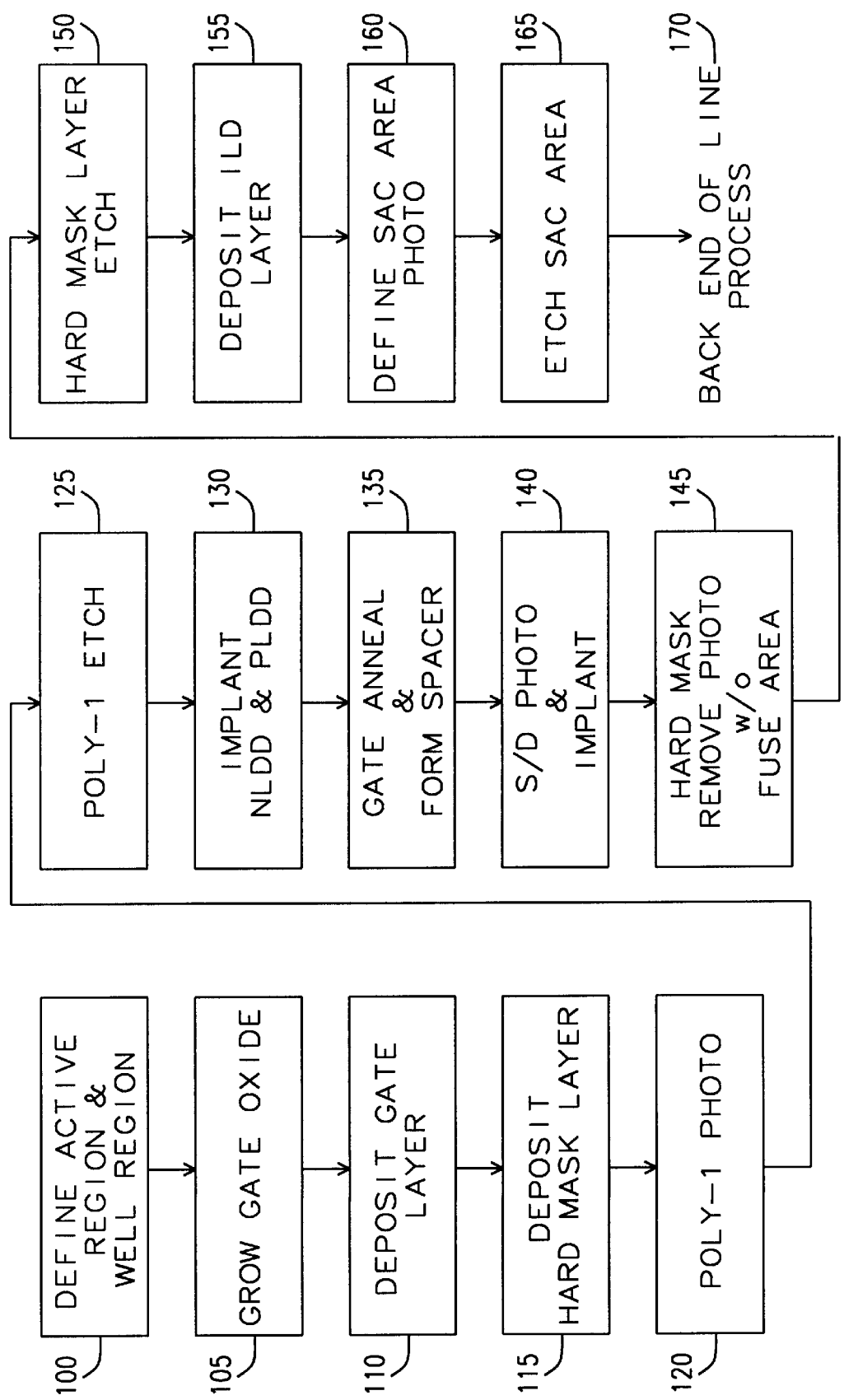
FIG. 2 – Prior Art

REDUNDANCY STRUCTURE IN SELF-ALIGNED CONTACTS

CROSS-REFERENCES TO RELATED APPLICATIONS

The present invention is a divisional application that claims priority under 35 U.S.C. §120 from application Ser. No. 09/329,783, filed Jun., 10, 1999, now U.S. Pat. No. 6,319,758.

BACKGROUND OF THE INVENTION

1. Field of the Invention

This invention relates to integrated circuits and electronic devices formed on a semiconductor substrate. Particularly, this invention relates to fuse link structures and methods of fabrication of fuse link structures that selectively implement redundant circuits with the integrated circuits.

2. Description of the Related Art

Often complex integrated circuits are formed on semiconductor substrates having redundant functional circuits. These redundant functional circuits are implemented to insure improved yields in the manufacture of the integrated circuits. To eliminate malfunctioning circuits and to substitute functioning redundant circuits for the malfunctioning circuits, fuse links are placed appropriately within the integrated circuits. An example of this is in memory integrated circuits such as dynamic random assess memory (DRAM) and static random access memory (SRAM). The memory array is formed with redundant rows and columns of memory cells connected to the row and column address decoders. Prior to final assembly of the memory integrated circuit into a functioning package, each integrated circuit chip or memory chip is tested for functionality. Those columns and rows of the memory array having nonfunctioning memory cells are eliminated from the memory array and the redundant memory rows and columns are implemented within the array to replace the malfunctioning columns and rows.

To perform the removal of the malfunctioning circuits and to implement the redundant circuit, destructible fuse links are formed at appropriate connective locations between operating functions of the integrated circuits, the redundant circuit functions, and the malfunctioning circuits. The fuse links are selectively destroyed to open the connection of the fuse link.

Conventionally, the fuse link is a layer conductive material such as a metal, a heavily doped polycrystalline silicon, or a layer of heavily doped polycrystalline silicon covered with a layer of a metal alloyed with the heavily doped polycrystalline silicon. The layer of conductive material is covered with a transparent insulative layer to protect the conductive material from contamination from the external environment.

If the fuse is to be destroyed, the fuse is subjected to excessive current or to an intensive laser light to sufficiently heat the layer of conductive material to destroy it. Currently, the conventional method of destruction is the use of an intense laser light. This requires the covering insulative layer be sufficiently transparent and sufficiently thin to allow the laser light to penetrate directly to the layer of conductive material.

U.S. Pat. No. 5,729,041 (Yoo et al.) describes a structure and method of forming a fuse and fuse window having a protective layer formed over them. The protective layer is highly transmissive to intense laser light while it is protective of the fuse and the surrounding insulating layers.

U.S. Pat. No. 4,651,409 (Ellsworth et al.) describes a fuse programmable read only memory (PROM). The fuse programmable PROM has a merged vertical fuse/bipolar transistor.

U.S. Pat. No. 5,754,089 (Chen et al.) describes a fuse structure in which a metallic frame is inserted between the interlayer dielectric insulation layers. The metallic frame is used as a mask to form the fuse window to simplify alignment and to minimize problems due to insulation residue on the surface of the fuse window layer.

U.S. Pat. No. 5,567,643 (Lee et al.) describes a method for creating a guard ring around a fuse link. The guard ring prevents contaminants from diffusing through a window opening above a fuse link to adjacent semiconductor devises. The guard ring is an annular metal ring that penetrates two or more insulating layers and contacts to the semiconductor substrate.

SUMMARY OF THE INVENTION

An object of this invention is to form a fuse link to implement redundant circuits within an integrated circuit.

Another object of this invention is to create a fuse link where an insulating layer over a conductive layer of the fuse link is sufficiently thin and sufficiently transparent to allow destruction of the conductive layer by an intense laser light.

To accomplish these and other objects, a redundancy structure for implementation of redundant circuits within an integrated circuit placed on a semiconductor substrate includes a fusible link. The fusible link is formed of a layer of a conductive material deposited upon an insulating layer of the semiconductor substrate connected between the redundant circuits and other circuits present on the integrated circuit. The insulating layer is generally a layer of field oxide placed on the surface of the semiconductor substrate. The layer of conductive material is either formed of a metal such as Aluminum (Al) or Tungsten (W), a heavily doped polycrystalline silicon, or an alloy of a metal such as Tungsten (W) and a heavily doped polycrystalline silicon.

A hard mask layer is placed upon the layer of conductive material during transistor processing to protect the layer of conductive material during formation of self-aligned sources and drains of transistors of the integrated circuit. The hard mask layer is removed from the layer of conductive material for deposition of interlayer dielectric layers on the semiconductor substrate to improve a fuse destruction to implement the redundant circuits.

An opening is formed in the interlayer dielectric layers to thin the interlayer dielectric layers to allow exposure of the layer of conductive material to facilitate destruction of the layer of conductive material.

The redundancy structure of this invention allows the redundant columns or rows of a DRAM array to be implemented and connected to the row address and column address decoders of the DRAM array to improve the yield of the DRAM array.

The hard mask layer is generally a single layer of silicon nitride or two layers composed of silicon dioxide and the second layer is silicon nitride. If the hard mask layer is a single layer of silicon nitride, it has of from approximately 1500 Å to approximately 3000 Å. However, if the hard mask layer is the two layer, the first layer of silicon dioxide has a thickness of from approximately 100 Å to approximately 1000 Å and the second layer of silicon nitride has a thickness of from approximately 1000 Å to approximately 3000 Å.

The opening in the interlayer dielectric above the layer of conductive material has a bottom portion that extends to between approximately 4000 Å and approximately 10,000 Å above the layer of conductive material. The interlayer dielectric is a layering of an undoped oxide and a borophososilicate glass and is formed such that the bottom portion of the opening in the interlayer dielectric has sufficient transparency to allow destruction of the layer of conductive material.

The hard mask layer is too thick and is thus removed to allow destruction of the layer of conductive material.

BRIEF DESCRIPTION OF THE DRAWINGS

FIGS. 1a–1l shows a cross-section of a semiconductor substrate as it is processed to form transistors of an integrated circuit and a fuse link used to implement the redundant circuit of the prior art.

FIG. 2 is a process flow diagram showing the steps to fabricate the transistors of the integrated circuit and the fuse link used to implement the redundant circuit of the prior art.

DETAILED DESCRIPTION OF THE INVENTION

Figure 3A:
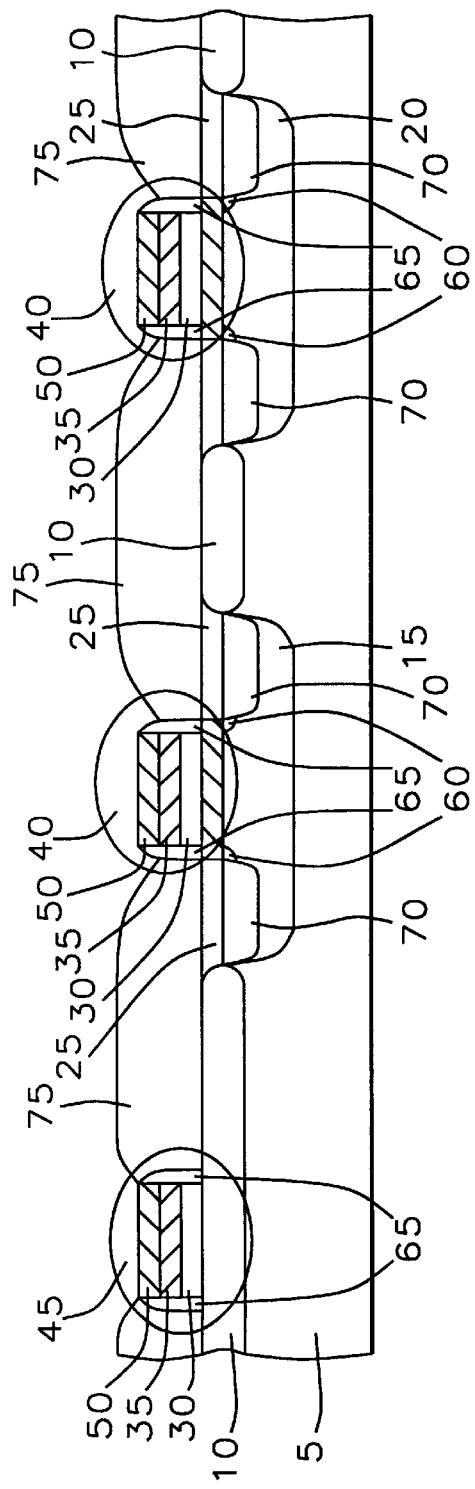
FIGS. 3a–3c show a cross-section of a semiconductor as it is processed to form transistors of an integrated circuit and a fuse link used to implement the redundant circuit of this invention.

Refer to FIGS. 1a–1l and FIG. 2 for a discussion of the conventional formation of a fuse link during the creation of the electronic components and transistors of an integrated circuit of the prior art. FIG. 1a shows the defining 100 of the active region 15 and the well region 20. An insulating material 10 such as a field oxide is formed on the surface of the semiconductor substrate 5. The insulating material is created with opening for the active region 15 and the well region 20. The well region 20 is then doped with a material having a conductivity opposite that of the semiconductor substrate 5.

FIG. 1b shows the growing 105 of a second insulating layer 25 that forms the gate oxide over the active region 15 and the well region 20. The gate oxide conventionally has a thickness of from approximately 30 Å to approximately 200 Å. In FIG. 1c a layer of heavily doped polycrystalline silicon 30 is deposited 110 on the second insulating layer 25 above the active region 15 and the well region 20 to form the gates 40 of the transistors of the integrated circuits. Simultaneously, the layer 30 of the heavily doped polycrystalline silicon is deposited on the field oxide 10 to form the conductive layer 45 of the fuse link. The layer of heavily doped polycrystalline silicon has a thickness of from approximately 1500 Å to approximately 3000 Å. A metal 35 such as tungsten is then deposited on and alloyed with the layer 30 of the heavily doped polycrystalline silicon to complete the deposition 110 of the gates 40, the active region 15, and the well region 20. Simultaneously, again, the metal 35 is deposited on and alloyed with the layer 30 of heavily doped polycrystalline silicon to complete the formation of the conductive layer 45 of the fuse link. The alloyed tungsten silicide (WSi2) has a thickness of from approximately 300 Å to approximately 1500 Å.

FIG. 1d illustrates the deposition 115 of a hard mask 50 on the gates 40 of the transistors and the conductive layer 45 of the fuse link. The hard mask 50 is conventionally a silicon nitride ($Si_xN_y$) deposited to a thickness of from approximately 1500 Å to approximately 3000 Å. Alternately, the hard mask 50 is a first layer of silicon dioxide ($SiO_2$) having a thickness of from approximately 100 Å to approximately 1000 Å with a second layer of silicon nitride ($Si_xN_y$) having a thickness of from approximately 1000 Å to approximately 3000 Å.

A photoresist material 55 is deposited 120 on the hard mask 55 as shown in FIG. 1e. The photoresist material has openings to expose the hard mask layer 50 in all areas of the semiconductor substrate except those areas that are the gates 40 of the transistors and the conductive layers 45 of the fuse link. The hard mask layer 50, the alloyed metal silicon layer 35, and the heavily doped polycrystalline silicon layer 30 are etched 125 leaving the gates 40 of the transistors and the conductive material 45 of the fuse link as shown in FIG. 1f.

The lightly doped drains and sources 60 of the transistors to be formed in the active region 15 and the well region 20 are implanted 130 as shown in FIG. 1g. The gates 40 are annealed 135 and the spacers 65 are formed as sidewalls for the gates 40 of the transistors and the conductive layer 45 of the fuse link as shown in FIG. 1h.

The surface of the semiconductor substrate is covered 140 with a photoresist having openings exposing the areas that are to be the sources and drains 70 of the transistors. A first heavy doping material is implanted in the active region 15 and a second heavy doping material of an opposite material is implanted in the well region 20 to form the sources and drains 70 of the transistors as shown in FIG. 1i. FIG. 1j illustrates a hard mask removal photoresist 75 deposited on the surface of the semiconductor substrate. The hard mask removal photoresist exposes 145 the hard mask layer 50 of the gates 40, while covering the hard mask layer 50 on the conductive layer 45 of the fuse link. The hard mask layer 50 of the gates 40 is removed 150 with an etchant process while the hard mask layer 50 of the conductive layer 45 of the fuse link remains intact.

At least one layer of an insulating material such as an undoped silicon dioxide with a borophososilicate glass (BPTEOS) is deposited 155 on the surface of the semiconductor substrate to form the interlayer dielectric (IMD) as shown in FIG. 1k. As FIG. 1l illustrates, openings 85 and 90 are defined 160 and etched 165 to form the self-aligned contacts (SAC) for the sources and drains 70 and the gates 40 of the transistors. At this same time, the opening 95 is defined 160 and etched 165 to create a window 95 in the interlayer dielectric 80. The window 95 exposes the hard mask layer 50 above the conductive layer 45 of the fuse link.

The openings 85 and 90 allow the connection of the gates 40, the drains and sources 70 to be interconnected 170 in the back end of the line process to form the integrated circuits.

The self-aligned contact process forces the hard mask layer 50 to be thicker than is desired for sealing the conductive layer 45 of the fuse link from the external atmosphere. The additional thickness of the hard mask layer is to provide better "etch stop" during processing of the transistors. However, the additional thickness causes a complex fuse structure that has a low "repair rate" when the fuses are destroyed with an intense laser light.

To mitigate the problems of the thickness of the hard mask of the conventional forming of the fuse link and the transistors of the integrated circuits, the hard mask layer 50 covering the conductive layer 45 of the fuse link is removed. The interlayer dielectric 80 is formed over the conductive layer 45 of the fuse link. The window 95 is formed to create the necessary opening in the interlayer dielectric 80.

Figure 3B:
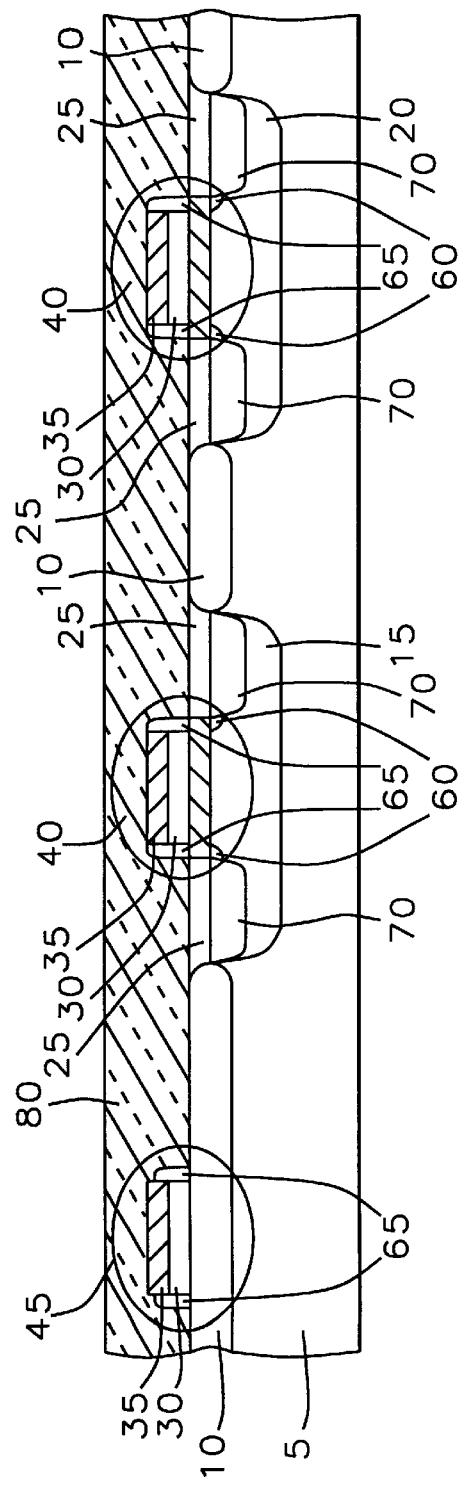
Figure 3C:
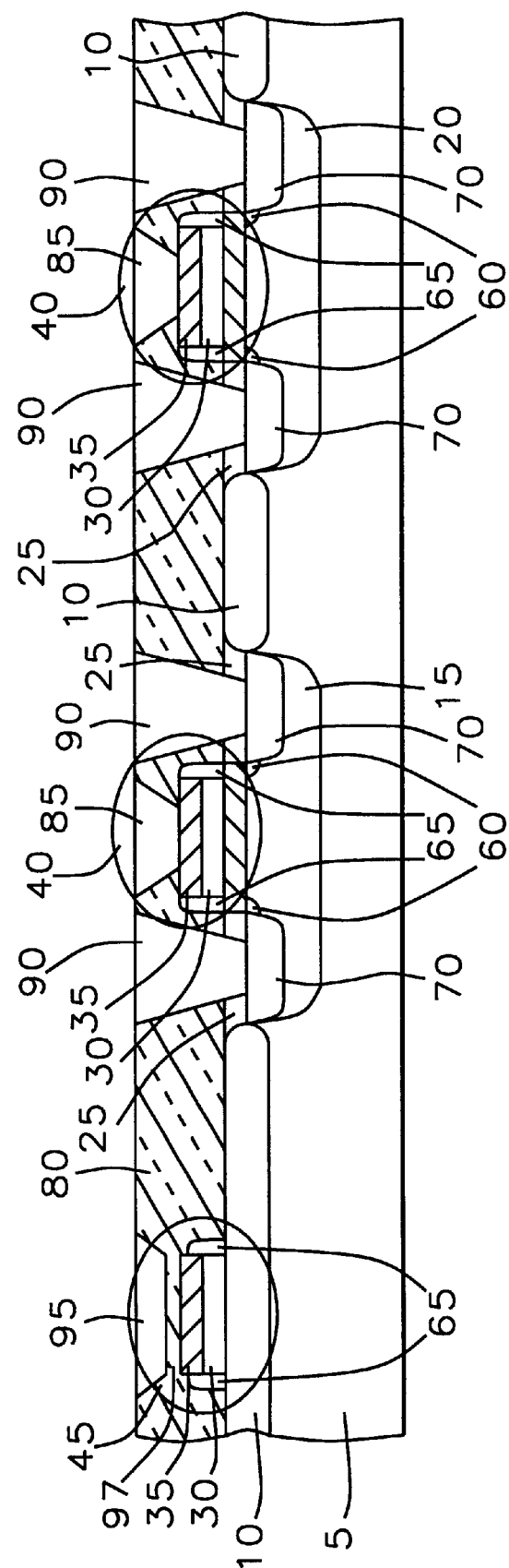
Figure 4:
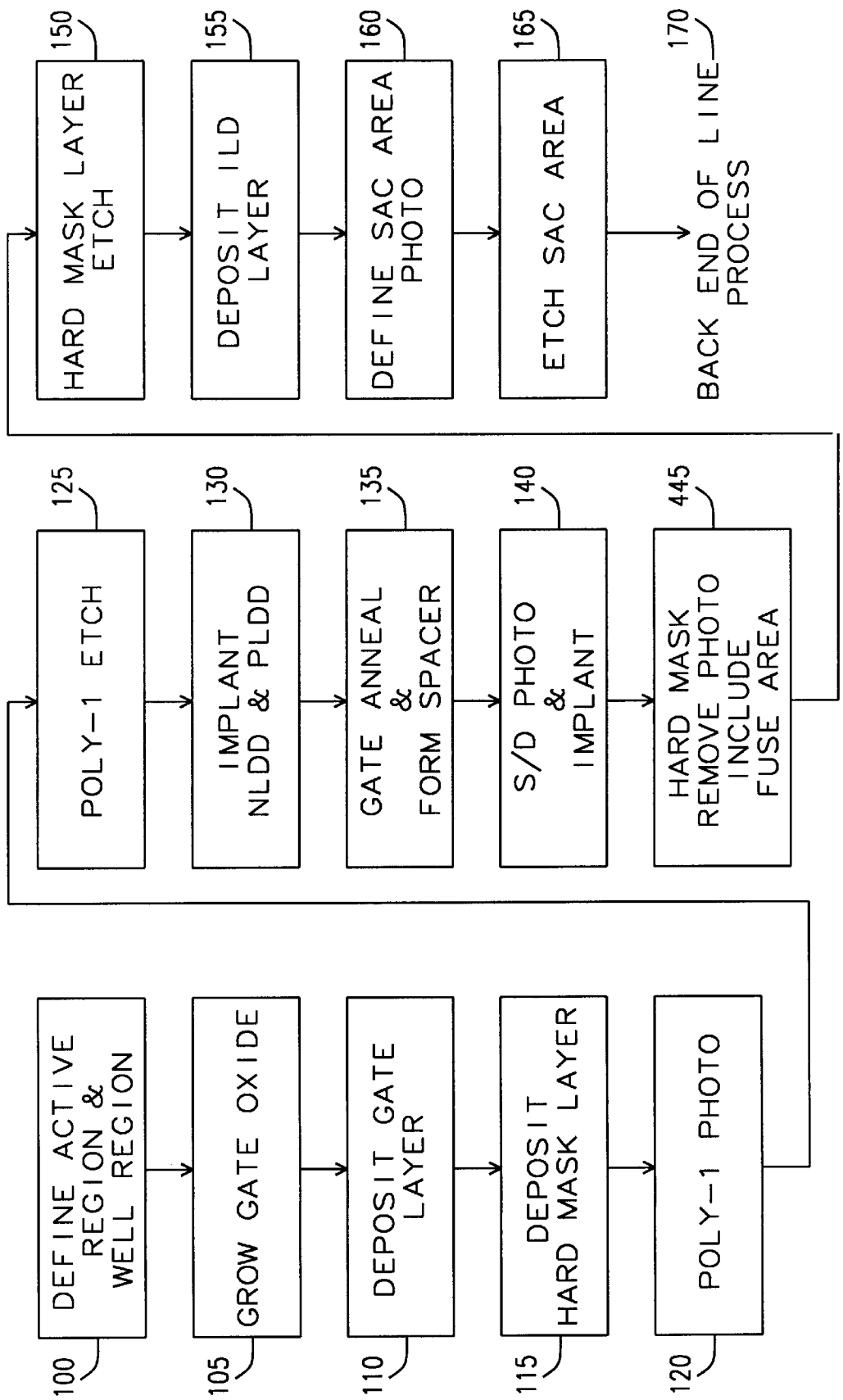
FIG. 4 is a process flow diagram showing the steps to fabricate the transistors of the integrated circuit and the fuse link used to implement the redundant circuit of this invention.

Refer to FIGS. 3a–3c and FIG. 4 for a complete discussion of the formation of the fuse link of this invention. The conductive layer 45 of the fuse link and the transistors of the integrated circuit are formed as described above for FIG. 2 step 100 though step 140. At step 445, a photoresist 75 is deposited on the surface of semiconductor substrate 5. Openings in the resist above the hard mask layer 50 of the conductive layer 45 and the gates 40 of the transistors permit the hard mask layer to be etched 150 to remove the hard mask layer 50 above the conductive layer 45 of the fuse link and the gates 40 of the transistors. The interlayer dielectric layer 80 is deposited 155 on the surface of the semiconductor substrate 5. The openings 90 and 95 are defined 160 with a photoresist and etched 165 to form the self-aligned contact areas of the transistors. The metalization is formed during the back end of the line process 170 to interconnect the transistors to form the integrated circuits.

The opening 95 is defined 160 with a photoresist and etched 165 to form the window above the conductive layer 45. The interlayer dielectric 80 is etched until a bottom portion 97 of the opening 95 approaches to within 4000 Å and approximately 10,000 Å of the conductive layer 45 of the fuse link. The thickness of the interlayer dielectric 80 at the bottom portion 97 of the window 95 must be sufficiently transparent to allow transmission of laser light to permit destruction of conductive layer 45 of the fuse link. At the same time, the thickness of the interlayer dielectric 80 at the bottom portion 97 of the window 95 must be sufficiently thick to prevent contamination of the conductive layer 45 of the fuse link from atmospheric exposure.

While this invention has been particularly shown and described with reference to the preferred embodiments thereof, it will be understood by those skilled in the art that various changes in form and details may be made without departing from the spirit and scope of the invention.

The invention claimed is:

1. An integrated circuit formed on a substrate comprising:
   at least one redundant circuit replicating a sub-circuit of said integrated, which when said sub-circuit is not operational, said sub-circuit is isolated from other sub-circuits of said integrated circuit and said redundant circuit is connected to the other sub-circuits; and
   at least one fuse link structure to connect said redundant circuit function to the other circuits of said integrated circuit, wherein said fuse link structure comprises:
      a layer of a conductive material deposited upon an insulating layer of said substrate connected between the redundant circuits and the other circuits present on said integrated circuit wherein a hard mask layer is placed upon said layer of conductive material during transistor processing to protect said layer of conductive material and removed from said layer of conductive material before deposition of interlayer dielectric layers on said substrate to improve a fuse destruction to implement said redundant circuits; and
      at least one opening in said interlayer dielectric layers to thin said interlayer dielectric layers to allow exposure of said layer of conductive material to facilitate destruction of said layer of conductive material.

2. The integrated circuit of claim 1 wherein said layer of conductive material is selected from a group of conductive materials consisting of metals, heavily doped polycrystalline silicon, and alloys of metals and heavily doped polycrystalline silicon.

3. The integrated circuit of claim 1 wherein the insulating layer is a field oxide.

4. The integrated circuit of claim 1 wherein the redundant circuit is a column of a DRAM array.

5. The integrated circuit of claim 1 wherein the redundant circuit is a row of a DRAM array.

6. The integrated circuit of claim 1 wherein the hard mask layer is silicon nitride.

7. The integrated circuit of claim 6 wherein a thickness of the silicon nitride of said hard mask layer is from approximately 1500 Å to approximately 3000 Å.

8. The integrated circuit of claim 1 wherein the hard mask layer is comprised of two layers whereby a first layer is silicon dioxide and a second layer is silicon nitride.

9. The integrated circuit of claim 8 wherein the first layer of silicon dioxide has a thickness of from approximately 100 Å to approximately 100 Å and the second layer of silicon nitride has a thickness of from approximately 100 Å to approximately 3000 Å.

10. The integrated circuit of claim 1 wherein the interlayer dielectric within the opening has a thickness of between 4000 Å and approximately 1000 Å over said layer of conductive material.

11. The integrated circuit of claim 1 wherein the interlayer dielectric is an undoped oxide and a borophososilicate glass.

12. The integrated circuit of claim 1 wherein the interlayer dielectric within the opening in the interlayer dielectric is transparent so as to allow destruction of the layer of conductive material.

13. The integrated circuit of claim 1 wherein the removed hard mask layer is too thick to allow destruction of said layer of conductive material.

* * * * *